(12) United States Patent
Chen et al.

(10) Patent No.: US 6,663,466 B2
(45) Date of Patent: Dec. 16, 2003

(54) CARRIER HEAD WITH A SUBSTRATE DETECTOR

(75) Inventors: Hung Chih Chen, San Jose, CA (US); Ming Kuei Tseng, San Jose, CA (US); Steven Zuniga, Soquel, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/441,928

(22) Filed: Nov. 17, 1999

(65) Prior Publication Data

US 2002/0002025 A1 Jan. 3, 2002

(51) Int. Cl.⁷ .................................................. B24B 49/00
(52) U.S. Cl. ............................ 451/8; 451/287; 451/288; 451/397; 451/398; 451/8
(58) Field of Search ......................... 451/287, 288, 451/289, 397, 398, 8, 9, 10

(56) References Cited

U.S. PATENT DOCUMENTS

| | | | |
|---|---|---|---|
| 4,918,869 A | 4/1990 | Kitta | 51/131.1 |
| 5,193,316 A | 3/1993 | Olmstead | 51/281 |
| 5,205,082 A | 4/1993 | Shendon et al. | 51/237 |
| 5,423,716 A | 6/1995 | Strasbaugh | 451/388 |
| 5,449,316 A | 9/1995 | Strasbaugh | 451/289 |
| 5,584,751 A | 12/1996 | Kobayashi et al. | 451/288 |
| 5,624,299 A | 4/1997 | Shendon | 451/28 |
| 5,643,053 A | 7/1997 | Shendon | 451/28 |
| 5,643,061 A | 7/1997 | Jackson et al. | 451/289 |
| 5,759,918 A | 6/1998 | Hoshizaki et al. | 438/692 |
| 5,803,799 A | 9/1998 | Volodarsky et al. | 451/288 |
| 5,851,140 A | * 12/1998 | Barns et al. | |
| 5,879,220 A | 3/1999 | Hasegawa et al. | 451/288 |
| 5,957,751 A | * 9/1999 | Govzman et al. | |
| 5,961,169 A | 10/1999 | Kalenian et al. | 294/64.1 |
| 5,964,653 A | 10/1999 | Perlov et al. | 451/288 |
| 6,024,630 A | * 2/2000 | Shendon et al. | |
| 6,050,882 A | * 4/2000 | Chen | |

FOREIGN PATENT DOCUMENTS

| | | |
|---|---|---|
| EP | 0 841 123 A1 | 5/1998 |
| EP | 0879 678 | 11/1998 |
| JP | 2243263 | 9/1990 |
| WO | WO 99/07516 | 2/1999 |
| WO | WO 99/33613 | 7/1999 |

* cited by examiner

Primary Examiner—Joseph J. Hail, III
Assistant Examiner—Willie Berry, Jr.
(74) Attorney, Agent, or Firm—Fish & Richardson

(57) ABSTRACT

A carrier head has a base, a flexible membrane, and a valve in the carrier head that forms part of a substrate detection system. The valve includes a valve stem that contacts an upper surface of the flexible membrane so that if a substrate is attached to the lower surface of the flexible membrane when the first chamber is evacuated, the valve is actuated to generate a signal to the substrate detection system.

19 Claims, 7 Drawing Sheets

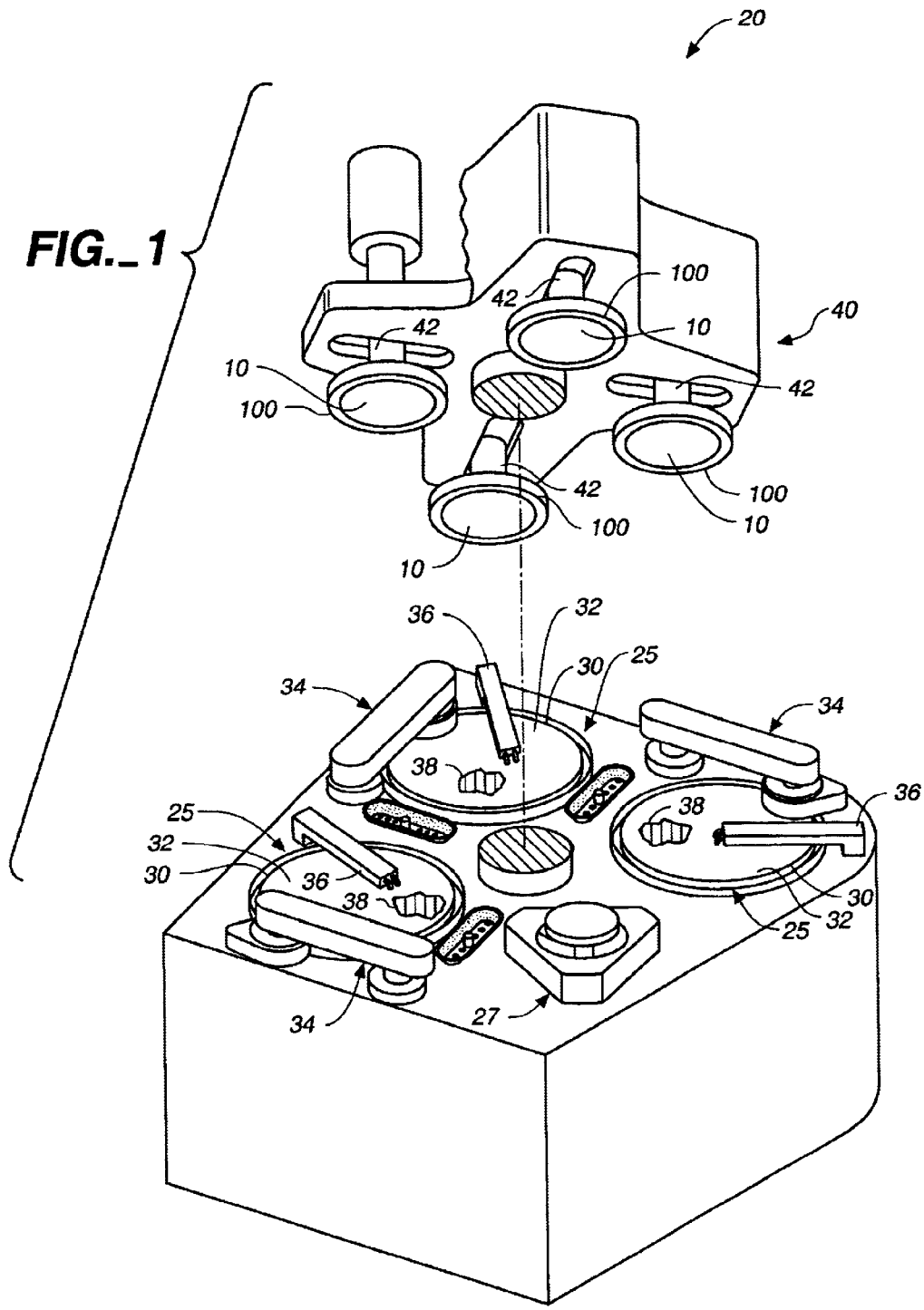
FIG._1

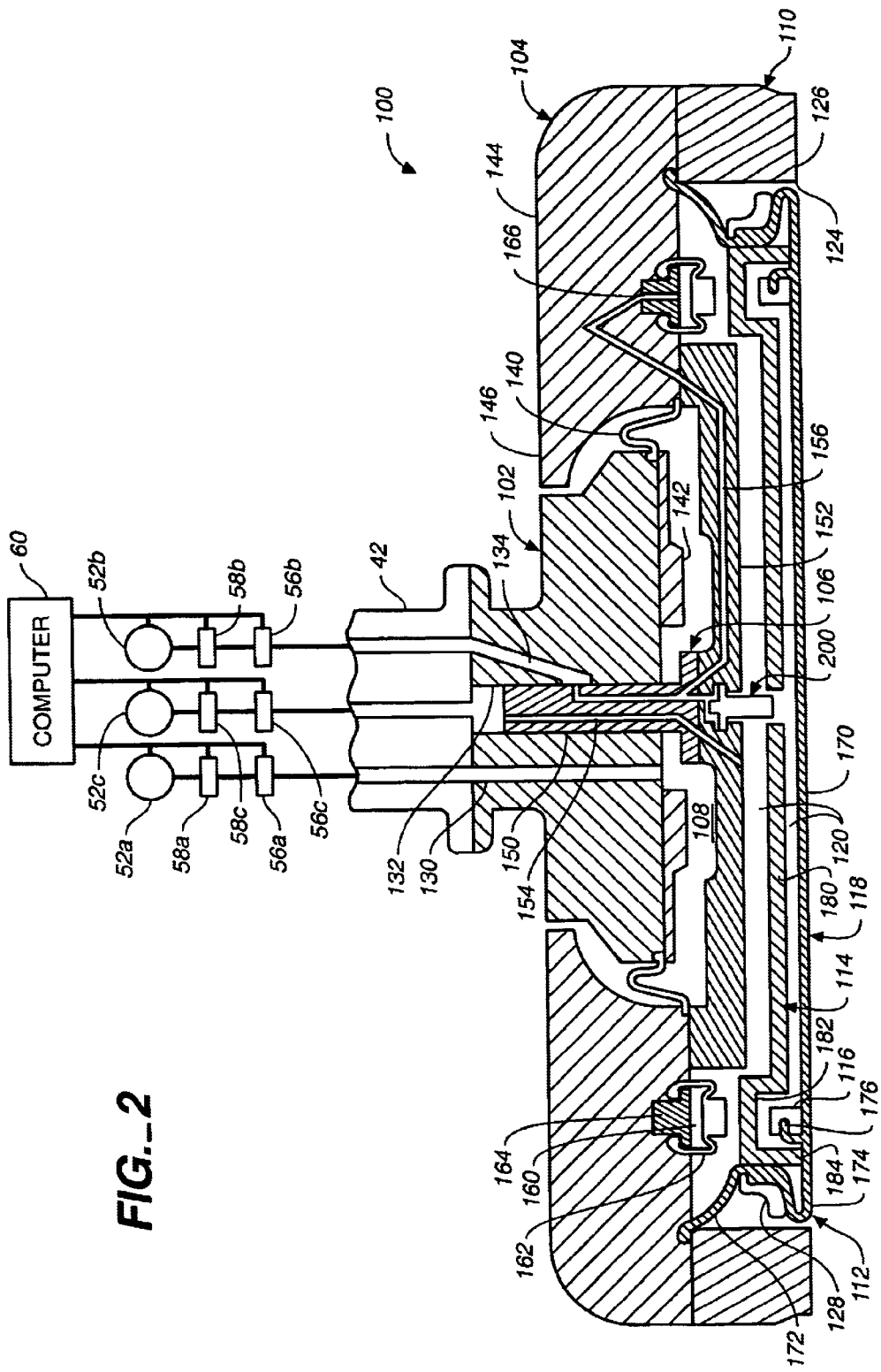
FIG._2

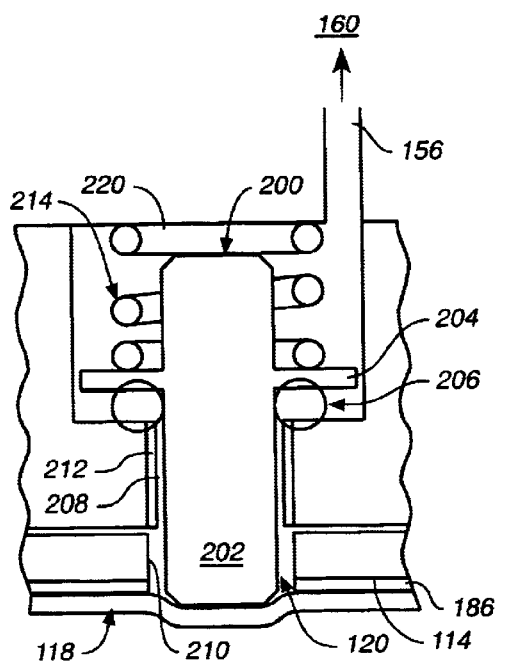
FIG._3A
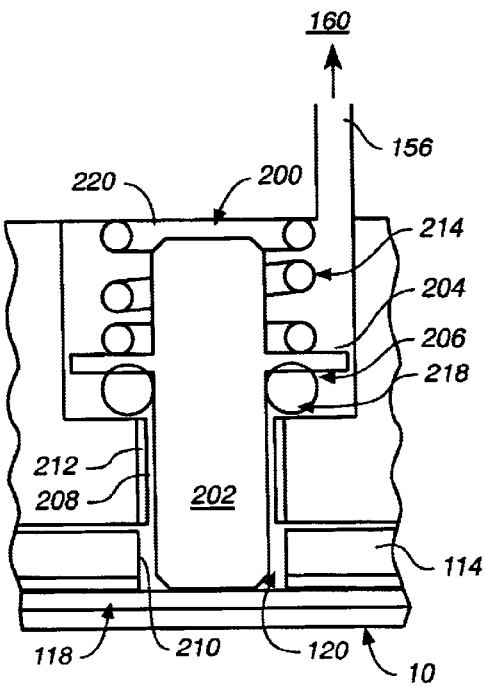
FIG._3B
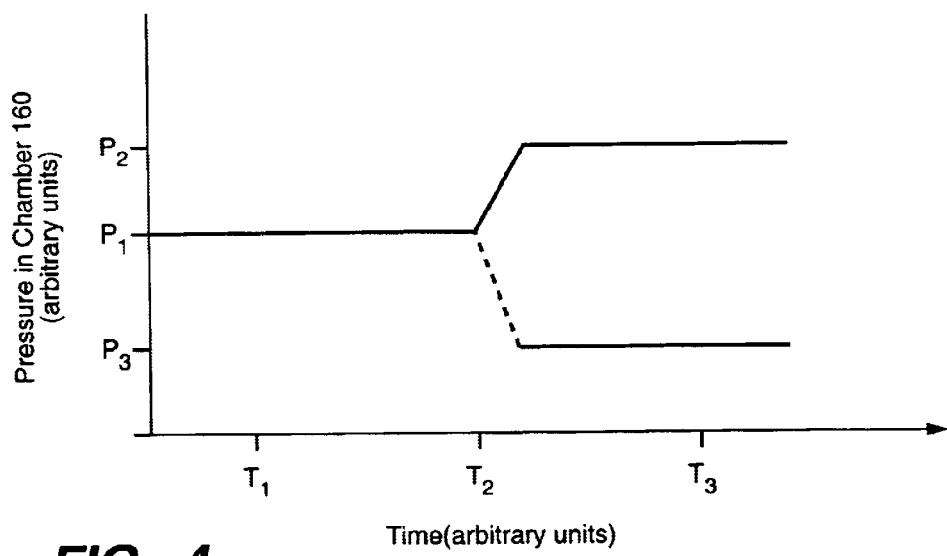
FIG._4

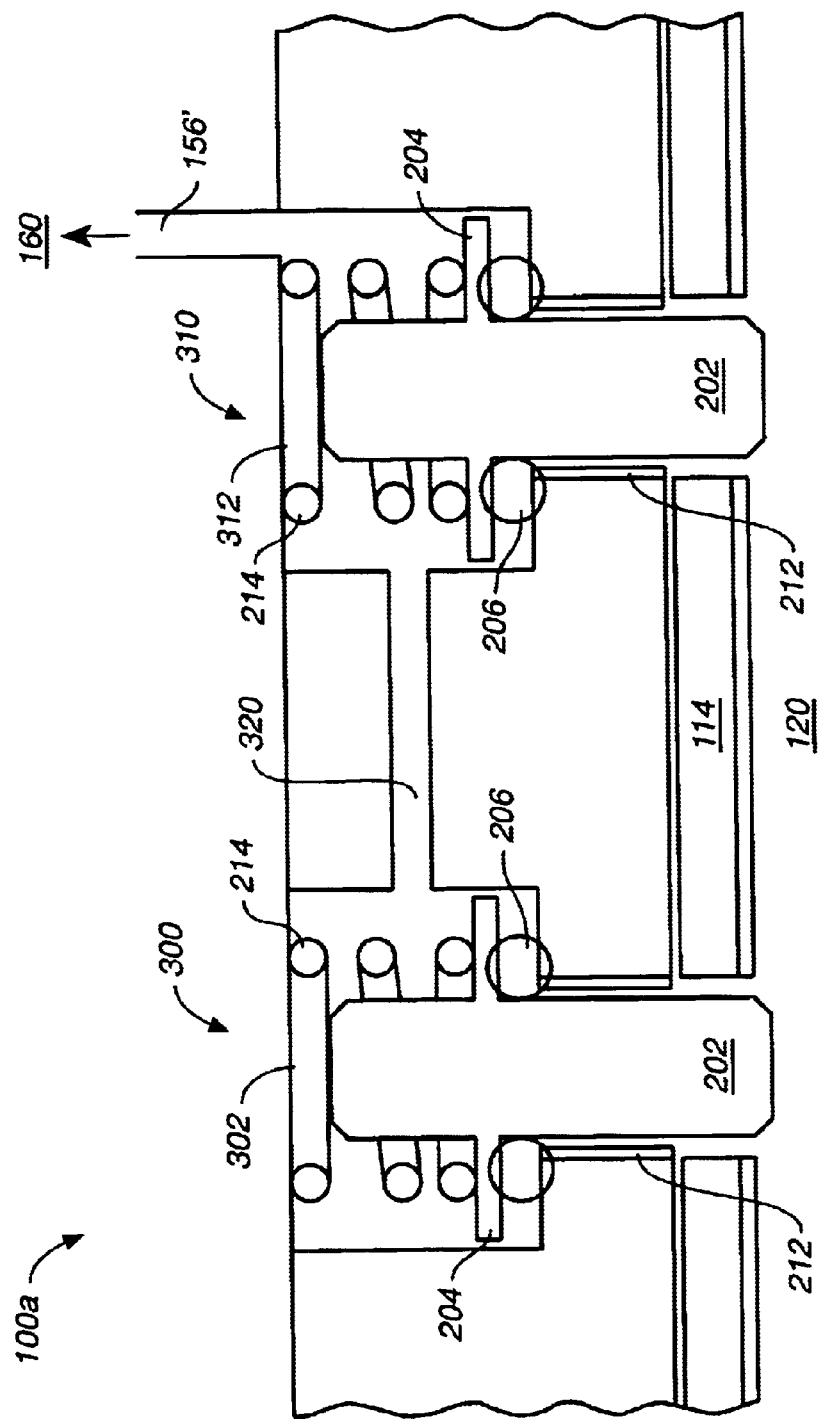
FIG._5

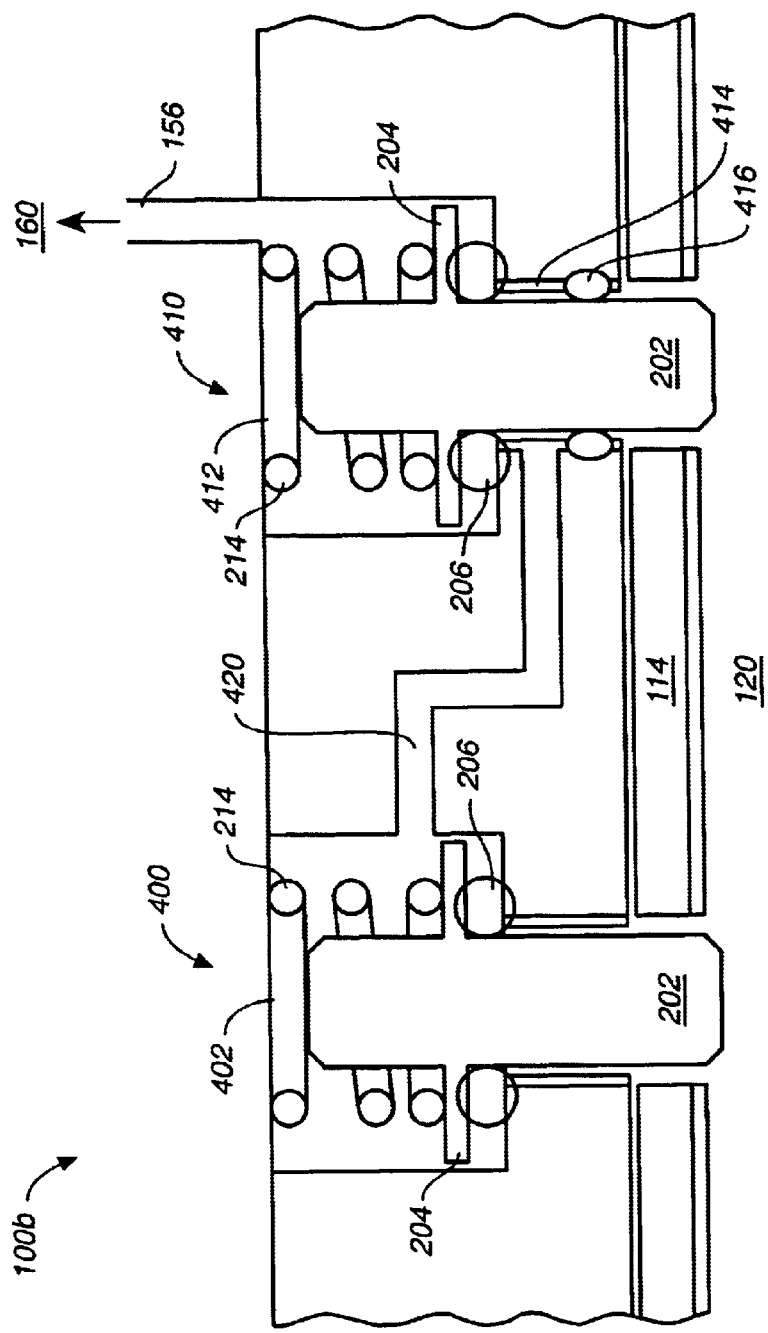
FIG._6

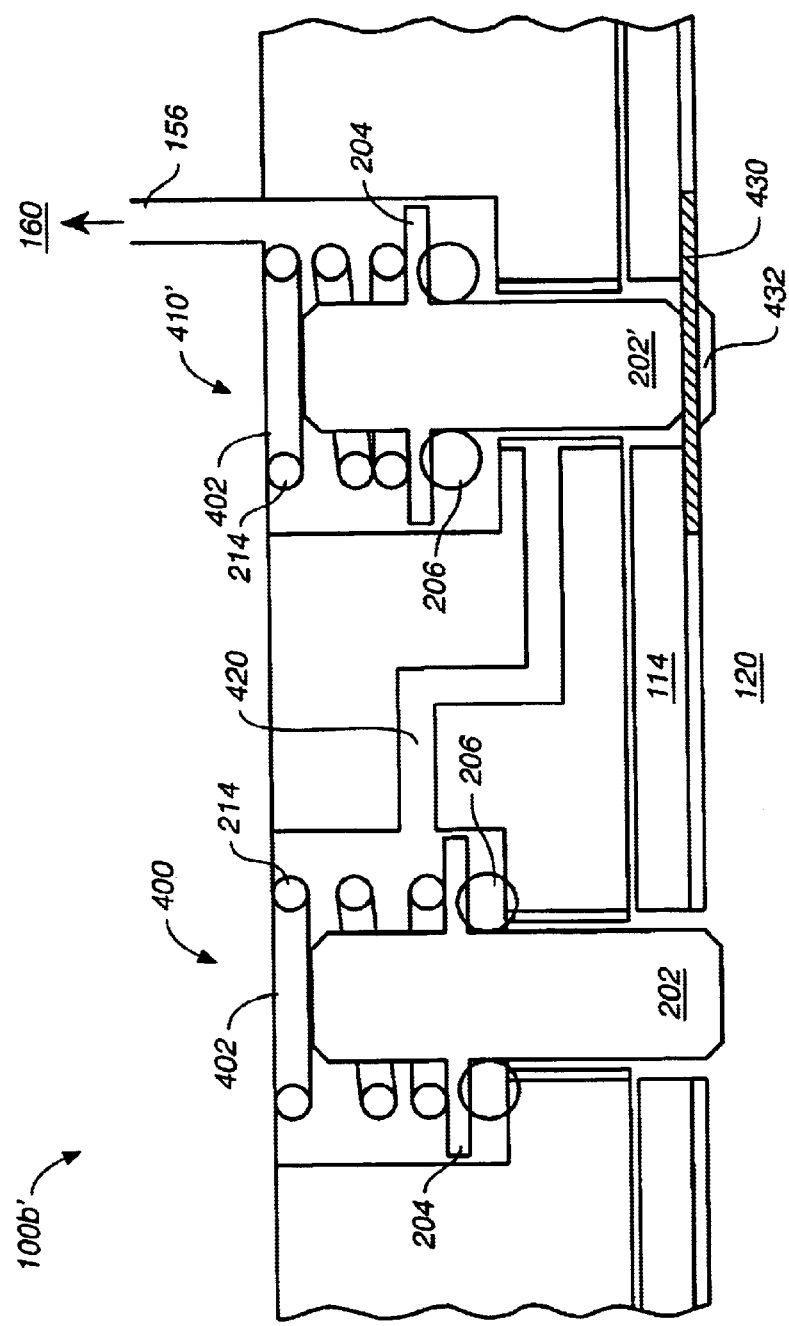
FIG._7

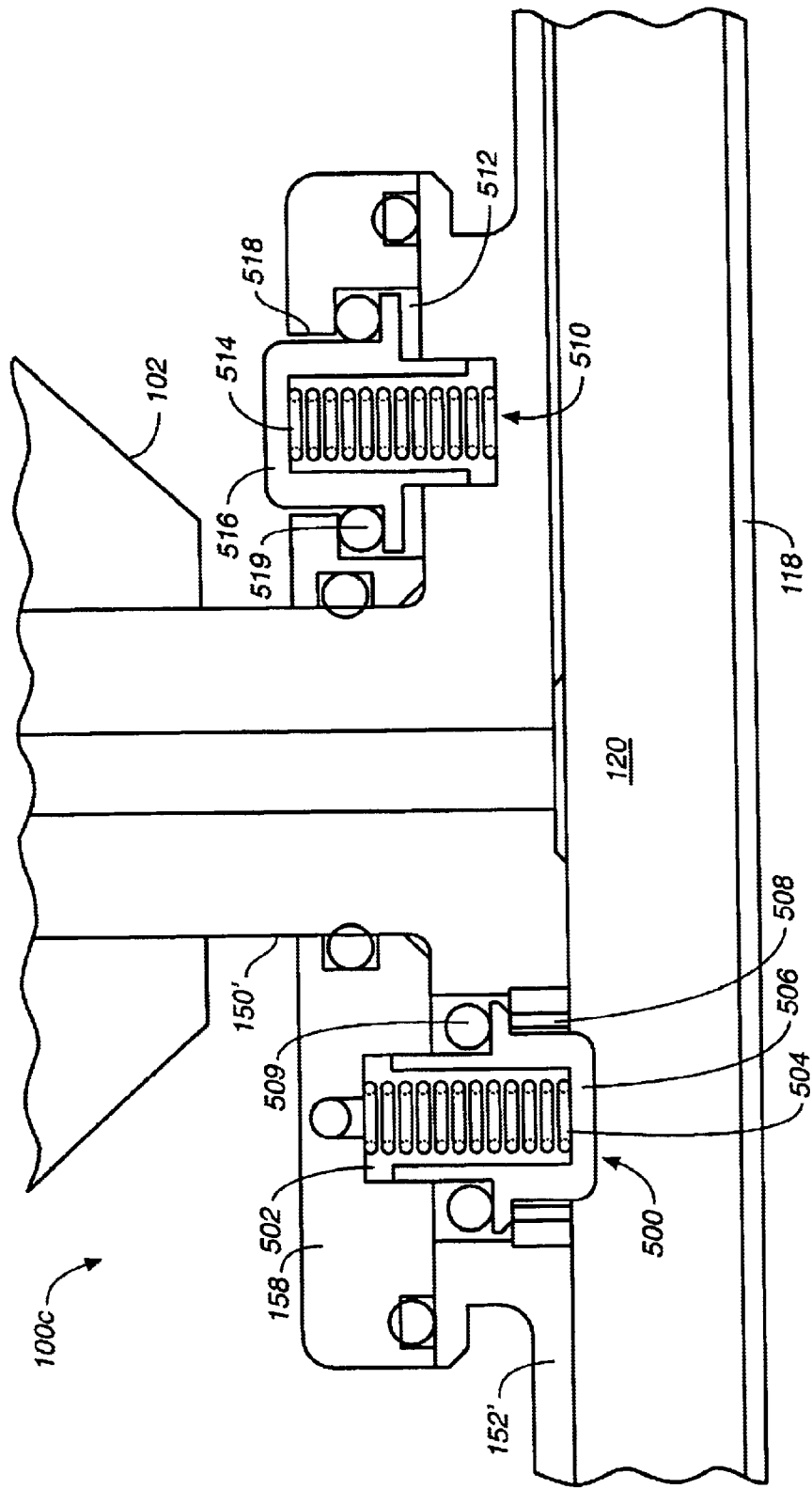
FIG._8

CARRIER HEAD WITH A SUBSTRATE DETECTOR

BACKGROUND

The present invention relates generally to chemical mechanical polishing of substrates, and more particularly to the detection of a substrate in a carrier head.

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes increasingly non-planar.

Chemical mechanical polishing (CMP) is one accepted method of planarizing a substrate surface. This planarization method typically requires that the substrate be mounted to a carrier or polishing head. The exposed surface of the substrate is then placed against a rotating polishing pad or moving polishing belt. The polishing pad may be a "standard" pad with a durable roughened surface, or a fixed-abrasive pad with abrasive particles embedded in a binder. The carrier provides a controllable load on the substrate to press it against the polishing pad. In addition, the carrier may rotate to affect the relative velocity distribution over the surface of the substrate. A polishing slurry, including at least one chemically-reactive agent, and an abrasive if a standard pad is being used, may be distributed over the polishing pad.

Typically, the carrier head is used to remove the substrate from the polishing pad after the polishing process has been completed. The substrate is vacuum-chucked to the underside of the carrier head. When the carrier head is retracted, the substrate is lifted off the polishing pad.

One problem that has been encountered in CMP is that the substrate may not be lifted by the carrier head. For example, if the surface tension binding the substrate to the polishing pad is greater than the force binding the substrate to the carrier head, then the substrate will remain on the polishing pad when the carrier head retracts. Also, if a defective substrate fractures during polishing, then the carrier head may be unable to remove the fractured substrate from the polishing pad.

A related problem is that the attachment of the substrate to the carrier head may fail, and the substrate may detach from the carrier head. This may occur if, for example, the substrate was attached to the carrier head by surface tension alone, rather than in combination with vacuum-chucking.

As such, an operator may not know that the carrier head no longer carries the substrate. The CMP apparatus will continue to operate even though the substrate is no longer present in the carrier head. This may decrease throughput. In addition, a loose substrate, i.e., one not attached to a carrier head, may be knocked about by the moving components of the CMP apparatus, potentially damaging the substrate or the polishing pad, or leaving debris which may damage other substrates.

Another problem encountered in CMP is the difficulty of determining whether the substrate is present in the carrier head. Because the substrate is located beneath the carrier head, it is difficult to determine by visual inspection whether the substrate is present in and properly attached to the carrier head. In addition, optical detection techniques are impeded by the presence of slurry.

A carrier head may include a rigid base having a bottom surface which serves as a substrate receiving surface. Multiple channels extend through the base to the substrate receiving surface. A pump or vacuum source can apply a vacuum to the channels. When air is pumped out of the channels, the substrate will be vacuum-chucked to the bottom surface of the base. A pressure sensor may be connected to a pressure line between the vacuum source and the channels in the carrier head. If the substrate was not successfully vacuum-chucked to the carrier head, then the channels will be open and air or other fluid will leak into the channels. On the other hand, if the substrate was successfully vacuum-chucked to the carrier head, then the channels will be sealed and air will not leak into the channels. Consequently, the pressure sensor will measure a higher vacuum or lower pressure when the substrate is successfully vacuum-chucked to the underside of the carrier head as compared to when the substrate is not attached to the carrier head.

Unfortunately, there are several problems with this method of detecting the presence of a substrate in the carrier head. Corrosive slurry may be suctioned into the channels and contaminate the carrier head. In addition, the threshold pressure for determining whether the substrate has been lifted from the polishing pad must be determined experimentally.

Accordingly, it would be useful to provide a CMP system capable of reliably sensing the presence of a substrate in a carrier head. It would also be useful if such a system could operate without exposing the interior of the carrier head to contamination by a slurry.

SUMMARY

In one aspect, the invention is directed to a carrier head that has a base, a flexible member that defines a first chamber and has a lower face that provides a substrate receiving surface, and a valve in the carrier head that forms part of a substrate detection system. The valve includes a valve stem that contacts an upper surface of the flexible membrane so that if a substrate is attached to the lower surface of the flexible membrane when the first chamber is evacuated, the valve is actuated to generate a signal to the substrate detection system.

Implementations of the invention may include the following features. The valve may be positioned in a passage that fluidly couples the first chamber to a second chamber. The valve may be biased in an open or closed position, and actuation of the valve may close or open the valve. The valve stem may extend through an aperture in a support structure, and may project slightly beyond a lower surface of the support structure. The support structure may be movable relative to the base. The valve may be biased by a spring, and the spring constant of the spring may be selected so that the force from the spring is sufficient to counteract a force from a flexible membrane when the substrate is not attached, but is insufficient to counteract a force from a flexible membrane when the substrate is attached. The valve stem may contacts the upper surface of the flexible membrane if the first chamber is evacuated. The flexible membrane may wrap around a lower portion of the valve if the substrate is not present.

In another implementation, the carrier head has a base, a flexible member that defines a first chamber and has a lower face that provides a substrate receiving surface, and a valve in the carrier head that forms part of a substrate detection system. The valve includes a valve stem that projects past a support surface, so that if the first chamber is evacuated and a substrate is attached to the lower surface of the flexible membrane, the substrate abuts the support surface and actuates the valve.

In another implementation, the carrier head has a base, a flexible member that defines a first chamber and has a lower face that provides a substrate receiving surface, and a plurality of valves in the carrier head that form part of a wafer detection system. If a substrate is attached to the flexible membrane when the first chamber is evacuated, either of the valves may be actuated to generate a signal to the wafer detection system.

In another implementation, the carrier head has a base, a flexible member that defines a first chamber and has a lower face that provides a substrate receiving surface, and a plurality of valves in the carrier head that form part of a wafer detection system. If a substrate is attached to the flexible membrane when the first chamber is evacuated, both of the valves must be actuated to generate a signal to the wafer detection system.

In another implementation, the carrier head has a base, a flexible member that defines a first chamber and has a lower face that provides a substrate receiving surface, a second chamber, a passage through the base between the first and second chambers, a first valve that is biased open and actuates to close the passage if the first chamber is evacuated a substrate is attached to the flexible membrane when the first chamber, and a second valve connected in series with the first valve, the second valve biased closed and actuatable to open the passage if the second chamber is evacuated.

Advantages of the invention include the following. The CMP apparatus includes a sensor to detect whether the substrate is properly attached to the carrier head. The sensor is less prone to false alarms.

Other advantages and features of the invention become apparent from the following description, including the drawings and claims.

BRIEF DESCRIPTION OF THE DRAWINGS

FIG. 1 is an exploded perspective view of a chemical mechanical polishing apparatus.

FIG. 2 is partially a schematic cross-sectional view of a carrier head with a flexible membrane and a chamber, and partially a schematic diagram of a pneumatic control system for the carrier head.

FIG. 3A is an expanded view of the valve from the carrier head of FIG. 2.

FIG. 3B is a view of the carrier head of FIG. 3A with an attached substrate.

FIG. 4 is a graph showing pressure as a function of time in a CMP apparatus using the carrier head of FIG. 2.

FIG. 5 is a schematic cross-sectional view of a carrier head that includes multiple valves connected in parallel.

FIG. 6 is a schematic cross-sectional view of a carrier head that includes multiple valves connected in series.

FIG. 7 is a schematic cross-sectional view of a carrier head in which valves are separated by a diaphragm.

FIG. 8 is a schematic cross-sectional view of a carrier head in which valves are biased in opposite directions.

Like reference numbers are intended in the various drawings to indicate like elements, although some elements in different implementations may have different structures, operations or functions.

DETAILED DESCRIPTION

Referring to FIG. 1, one or more substrates 10 will be polished by a chemical mechanical polishing (CMP) apparatus 20. A complete description of a CMP apparatus can be found in pending U.S. Pat. No. 5,738,574, the entire disclosure of which is hereby incorporated by reference. The CMP apparatus 20 includes a series of polishing stations 25 and a transfer station 27.

Each polishing station 25 includes a rotatable platen 30 on which is placed a polishing pad 32. Each polishing station may further include an associated pad conditioner apparatus 34 to periodically recondition the polishing pad surface. Each polishing station can also include a combined slurry/rinse arm 36 to supply a slurry 38 containing an active agent (e.g., deionized water for oxide polishing), abrasive particles (e.g., silicon dioxide for oxide polishing) and a chemically-reactive catalyzer (e.g., potassium hydroxide for oxide polishing) to the surface of polishing pad 32.

The CMP apparatus 20 also includes a rotatable multi-head carousel 40 that supports four carrier heads 100. Three of the carrier heads receive and hold substrates and polish them by pressing them against the polishing pad 32 on platen 30 of polishing stations 25. One of the carrier heads receives a substrate from and delivers the substrate to transfer station 27. The carousel can rotate to orbit the carrier heads, and the substrates attached thereto, between the polishing stations and the transfer station. Each carrier can be independently rotated about its own axis, and independently laterally oscillated by a drive shaft 42.

Generally, carrier head 100 holds the substrate against the polishing pad and evenly distributes a force across the back surface of the substrate. The carrier head also transfers torque from the drive shaft to the substrate and ensures that the substrate does not slip from beneath the carrier head during polishing.

Referring to FIG. 2, carrier head 100 includes a housing hub 102, a base 104, a loading chamber 108, a retaining ring 110, and a substrate backing assembly 112. Descriptions of similar carrier heads may be found in U.S. Pat. No. 5,957,751, and in pending U.S. application Ser. No. 09/169,500, filed Oct. 9, 1998, each of which is incorporated herein by reference in its entirety.

The housing hub 102 is connected to drive shaft 42 to rotate therewith about an axis of rotation which is substantially perpendicular to the surface of the polishing pad. Three passages 130, 132 and 134 are formed through housing hub 104 for pneumatic control of the carrier head.

Base 104 includes a gimbal mechanism 106 and an outer clamp ring 144. The vertical position of base 104 relative to housing hub 102 is controlled by loading chamber 108. Chamber 108 also controls the downward pressure on base 104 and retaining ring 110. Loading chamber 108 is sealed by a diaphragm 140 that is clamped to housing hub 102 by an inner clamp ring 142 and clamped to base 104 between outer clamp ring 144 and flexure ring 152. Outer clamp ring 144 includes an inwardly projecting flange 146 which extends over a lip of housing hub 102 to prevent over-extension of the carrier head and to prevent slurry from contaminating diaphragm 140.

A first pump or pressure source 52a may be connected to loading chamber 108 via passage 130 in housing hub 102. If pump 52a pumps fluid into loading chamber 108, the volume of the chamber will increase and base 104 will be pushed downwardly. On the other hand, if pump 52a pumps fluid out of loading chamber 108, the volume of chamber 108 will decrease and base 104 will be pulled upwardly.

Gimbal mechanism 106 permits base 104 to move with respect to housing hub 102 so that the retaining ring may remain substantially parallel with the surface of the polishing pad. Gimbal mechanism 106 includes a gimbal rod 150 and a flexure ring 152. Gimbal rod 150 may slide vertically in passage 132 in housing 102 so that base 104 can move vertically with respect to housing 102. However, gimbal rod 150 prevents any lateral motion of base 104 with respect to housing 102. A first passage 154 can be formed through gimbal rod 150, and a second passage 156 can be formed through gimbal rod 150, flexure ring 152 and outer clamp ring 144 for pneumatic control of the carrier head.

Retaining ring 110 may be secured at the outer edge of base 104. Retaining ring 110 can have a flat bottom surface 126, or the bottom surface can include channels to permit slurry flow. When fluid is pumped into chamber 108 and base 104 is pushed downwardly, retaining ring 110 is also pushed downwardly to apply a load to polishing pad 32. An inner surface of 124 retaining ring 110 restrains the substrate from lateral motion.

A membrane 162 may be clamped to a lower surface of base 104 by a clamp ring 164 to form an annular bladder 160. A passage 166 extends through clamp ring 164 and is aligned with passage 156 in base 104. A second pump or pressure source 52b can connected to bladder 160 via passage 134 in housing hub 102, passage 156 in base 104, and passage 166 in clamp ring 164. If pump 52b forces a fluid into bladder 160, then bladder 160 will expand downwardly. On the other hand, if pump 52b evacuates fluid, then bladder 160 will contract. As discussed below, bladder 160 may be used to apply a downward pressure to support structure 114 and flexible membrane 118.

The substrate backing assembly 112 includes a flexible membrane 118, a support ring 116, a support structure 114, and a spacer ring 128. Each of these elements will be explained in greater detail below.

Flexible membrane 118 is a generally circular sheet formed of a flexible and elastic material with a central portion 170 and a peripheral portion 172 that extends between spacer ring 128 and support plate 114. The central portion 170 of flexible membrane 118 extends below support structure 114 to provide a mounting surface for the substrate. An inner edge of the peripheral portion 172 is folded back over the perimeter of the central portion 170 to form an expandable lip 174, as discussed in pending U.S. application Ser. No. 09/296,935, filed Apr. 22, 1999, the entirety of which is incorporated herein by reference. An outer edge of membrane 118 is clamped between retaining ring 110 and outer clamp ring 144 to define a pressurizable chamber 120.

A third pump or pressure source 52c can be connected to chamber 120 via passage 154 in gimbal rod 150. If pump 52c forces a fluid into chamber 120, then the volume of the chamber will increase and flexible membrane 118 will be forced downwardly. On the other hand, if pump 52c evacuates air from chamber 120, then the volume of the chamber will decrease and the membrane will be drawn upwardly.

Spacer ring 128 is an annular body positioned between support structure 114 and retaining ring 110 to maintain the proper shape of flexible membrane 118. Spacer ring 128 can rest on the lip portion of flexible membrane 118.

Support ring 116 is an annular piece with a C-shaped cross-section that rests inside chamber 120 on flexible membrane 118. The central portion 170 of flexible membrane 118 can include an inwardly extending flap 176 that engages support ring 116 to maintain the proper shape of flexible membrane 118.

Support structure 114 also rests inside chamber 120 on flexible membrane 118. The support structure 114 includes a disk-shaped plate portion 180 with a plurality of unillustrated apertures, an outwardly extending flange portion 182 that extends over support ring 116, and a downwardly extending flange portion 184 that extends between support ring 116 and peripheral portion 172 of flexible membrane to rest on the central portion 170 of the flexible membrane.

The CMP apparatus of the present invention is capable of detecting whether a substrate is properly attached to carrier head 100. If the CMP apparatus detects that the substrate is missing or is improperly attached to the carrier head, the operator may be alerted and polishing operations may be automatically halted.

Three pressure sensors or gauges 56a, 56b and 56c may be connected to the fluid lines between pumps 52a, 52b and 52c, and chambers 108, 160, and 120, respectively. Controllable valves 58a, 58b and 58c may be connected across the fluid lines between pressure gauges 56a, 56b and 56c, and pumps 52a, 52b and 52c, respectively. Pumps 52a–52c, pressure gauges 56a–56c and valves 58a–58c may be appropriately connected to a general-purpose digital computer 60. Computer 60 may operate pumps 52a–52c, as described above, to pneumatically power carrier head 100 and to vacuum-chuck a substrate to the bottom of the carrier head. In addition, computer 60 may operate valves 58a–58c and monitor pressure gauges 56a–56c, as described in more detail below, to sense the presence of the substrate in the carrier head.

Referring to FIGS. 3A and 3B, the carrier head 100 includes a mechanically actuated valve 200 to provide the carrier head with a wafer detection capability. In one implementation, passage 156 is connected to a chamber 220 in flexure ring 152, and valve 200 is positioned near the center of the carrier and extends between chamber 220 and chamber 120. In this implementation, valve 200 includes a valve stem 202, an annular flange 204 that extends radially outwardly from the valve stem 202, an O-ring 206, and a spring 214. Valve stem 202 extends through an aperture 208 in flexure ring 152 between valve chamber 220 and lower chamber 120, with valve flange 204 positioned in valve chamber 220. The portion of valve stem 202 that extends into lower chamber 120 passes through an aperture 210 in support structure 114. When lower chamber 120 is evacuated and support structure 114 is retracted against base 104, valve stem 202 can extend slightly below a bottom surface 186 of support structure 114. Channels 212 may be formed in flexure ring 152 surrounding aperture 208 and valve stem 202 to connect chamber 120 to valve chamber 220. However, O-ring 206 is positioned around valve stem 202 in valve chamber 220 between annular flange 204 and flexure ring 152. In addition, spring 214 is positioned between annular flange 204 and a ceiling 222 of valve chamber 220. Spring 214 biases the valve 200 into a closed position. (as shown in FIG. 3A). More specifically, O-ring 206 is compressed between annular flange 204 and flexure ring 152 to seal channels 212 from valve chamber 220, thereby isolating valve chamber 220 from lower chamber 120. However, if valve stem 202 is forced upwardly (as shown in FIG. 3B), then O-ring 206 will no longer be compressed and fluid may leak through a gap 218 around the O-ring. As such, valve 200 will be open and valve chamber 220 and lower chamber 120 will be in fluid communication via channels 212.

A CMP apparatus including carrier head 100 senses whether the substrate has been successfully vacuum-chucked to the carrier head as follows. The substrate is positioned against the flexible membrane 118. Pump 52b inflates bladder 160 to a predetermined pressure, and then valve 58b is closed to isolate bladder 160 from pump 52b. A first measurement of the pressure in bladder 160 is made by means of pressure gauge 56b. Then pump 52c evacuates lower chamber 120 to create a low-pressure pocket between the flexible membrane and the substrate in order to vacuum chuck the substrate to the carrier head. Then a second measurement of the pressure in bladder 160 is made by means of pressure gauge 56b. The first and second pressure measurements may be compared to determine whether the substrate was successfully vacuum-chucked to the carrier head.

Carrier head 100 is configured so that valve 200 will actuate if the substrate is present, and will not actuate if the substrate is absent. As shown in FIG. 3A, if the substrate is not present, then when chamber 120 is evacuated, flexible membrane 118 will move upwardly and contact the valve stem. However, since flexible membrane 118 is flexible and is partly supported against support structure 114 when chamber 120 is evacuate, the flexible membrane will tend to wrap around the valve stem, and the upward tension force on valve stem 202 from flexible membrane 118 will be insufficient to overcome the downward spring force from spring 204, and the valve 200 will remain closed. On the other hand, as shown in FIG. 3B, if the substrate is vacuum-chucked to the flexible membrane, the relatively rigid substrate will press on valve stem 202. In this case, the upward tension force from flexible membrane 118 and substrate 10 will overcome the downward spring force from spring 204, and the valve 200 will open, thereby fluidly connecting lower chamber 120 to valve chamber 220. This permits fluid to be drawn out of bladder 160 through valve chamber 220 and lower chamber 120, and evacuated by pump 52c.

It should be noted that spring 204 is selected to provide a downward force that is sufficient to counteract the upward force applied by the membrane alone, but insufficient to counteract the upward force applied when a substrate is attached to the membrane. In general, the larger the aperture 210 in support structure 114, the stiffer the membrane 118, and the farther the valve stem 202 extends past lower surface 176, the more force flexible membrane 118 will apply to the valve stem 202, and the larger the spring constant of spring 204 will need to be. However, a lower spring constant results in less stress on the substrate as the valve is actuated.

Referring to FIG. 4, bladder 160 may initially be at a pressure $P_1$. The first pressure measurement is made at time $T_1$ before pump 52c begins to evacuate lower chamber 120. When chamber 120 is evacuated at time $T_2$, flexible membrane 118 is drawn upwardly. If the substrate is present, valve 200 remains closed, and the pressure in bladder 160 will remain constant at pressure $P_1$, or even rise to a pressure $P_2$ if support structure 114 applies an upward force to compress the bladder 160. Thus, the pressure in bladder 160 measured by gauge 56b will remain at or above pressure $P_1$. On the other hand, if the substrate is present, then valve 200 is opened and fluid is evacuated from volume 160 so that the pressure measured by gauge 56b falls to pressure $P_3$. Therefore, if the second measured pressure is less than the first measured pressure, the substrate is attached to the carrier head. However, if the second measured pressure is equal to or larger than the first measured pressure, the substrate is not attached to the carrier head.

Computer 60 may be programmed to store the two pressure measurements, compare the pressure measurements, and thereby determine whether the substrate was successfully vacuum-chucked to the carrier head. This can provide an extremely reliable substrate detector that is not subject to "false" signals, e.g., indications that the substrate is absent when it is, in fact, present. In addition, the sensor is contained within the carrier head behind the flexible membrane, so that the sensor does not provide an opportunity for slurry to contaminate the interior of the carrier head.

Referring to FIG. 5, in another implementation, carrier head 100a includes two or more valves 300, 310 connected in parallel between lower chamber 120 and bladder 160. For example, the first valve can extend between lower chamber 120 and a first chamber 302, whereas the second valve can extend between lower chamber 120 and a second chamber 312. A passage 320 in flexure ring 154 can connect first chamber 302 to second chamber 312. Thus, chamber 120 will be connected to bladder 160 if either or both valves 300 is triggered. This implementation increases the sensitivity of the carrier head to the presence of the wafer, and provides redundancy in case one valve becomes stuck. In addition, if the carrier head includes three or more valves spaced at equal angular intervals around the carrier base, the substrate will not be tilted as it is lifted.

Referring to FIG. 6, in another implementation, carrier head 100b includes two or more valves 400, 410 connected in series between chamber 120 and bladder 160. For example, the first valve can extend between lower chamber 120 and a first chamber 402, and a passage 420 through flexure ring 152 can connect first chamber 402 to a passage 414 that is sealed from a second chamber 412 by the O-rings of second valve 410. The second chamber 412 is connected to bladder 160 by passage 156. In short, the input of first valve 400 is connected to chamber 120, the output of the first valve 400 is connected to the input of second valve 402 by passage 420, and the output of second valve 410 is connected to bladder 160. Thus, chamber 120 will be connected to bladder 160 only if both valves 400 and 410 are triggered. This implementation increases the sensitivity of the carrier head to the absence of the substrate and to situations in which the substrate is not sufficiently firmly secured to the flexible membrane, e.g., if the substrate is attached to the flexible membrane by surface tension alone, and not by vacuum-chucking, and tilts rather than actuating both sensors. The input passage 414 of second valve 410 can be separated from chamber 120, while allowing the valve stem of second valve 410 to extend into the chamber 120, by O-rings 416.

As shown in FIG. 7, a flexible diaphragm 430 can be used instead of O-rings to separate passage 414 of second valve 410' from the chamber 120. Valve stem 202' of valve 410' can rest on diaphragm 430, and a bumper 432 can be affixed to the underside of diaphragm 430. Flexible diaphragm 430 is sufficiently elastic that when bumper 432 is pressed upwardly by flexible membrane 118, bumper 432 can be forced up into aperture 210' in support structure 114, thus forcing valve stem 202' upwardly to actuate second valve 410'.

Referring to FIG. 8, in another implementation, carrier head 100c includes two valves 500 and 510 connected in series between chambers 120 and 108. This implementation would be appropriate for the carrier head discussed in pending U.S. application Ser. No. 60/114,182, filed Dec. 30, 1998. In this implementation, the valves 500 and 510 can be formed between flexure ring 152' and an annular gimbal clamp 158, and multiple fluid passages through the gimbal rod and the flexure ring are not required. First valve 500 fluidly connects chamber 120 to a first valve chamber 502 via channels 508 in flexure ring 152' surrounding valve stem 506, second valve 510 fluidly connects chamber 108 to a second valve chamber 512 via channels 518 in gimbal clamp 158 surrounding valve stem 516, and first valve chamber 502 is connected to second valve chamber 512 by an unillustrated passage. The first valve 500 is biased open by spring 504, and second valve 510 is biased closed by spring 514. If the lower chamber 120 is evacuated and a substrate is vacuum-chucked to the carrier head, then valve stem 506 of first valve 500 will be actuated to press O-ring 506 against gimbal clamp 158 to close the first valve, and the pressure in chamber 108 will remain constant. On the other hand, if the lower chamber 120 is evacuated but no substrate is present, then first valve 500 will remain open. If loading chamber 108 is also evacuated when chamber 120 is evacuated, e.g., in order to lift the entire substrate backing assembly and the retaining ring away from the polishing pad, then valve stem 516 will be pressed against housing hub 102. This generates a downward force on the valve stem which can overcome an upward force from spring 514 that presses O-ring against gimbal clamp 158, causing the second valve 510 to open and thus connecting loading chamber 108 to lower chamber 120. Fluid will then flow out of loading chamber 108 via lower chamber 120. On the other hand, if the loading chamber 108 is pressurized when chamber 120 is evacuated, e.g., to control the contact area and pressure on the substrate during polishing, then valve 510 will remain closed. In sum, the valve assembly will be actuated to connect loading chamber 108 to lower chamber 120 only if a substrate is not present and chamber 108 is evacuated. The drop in pressure in lower chamber 120 can be detected by pressure gauge 52c to indicate that the substrate is not present.

Alternatively, carrier head 100c could include a single valve that opens when chamber 120 is evacuated if a substrate is present. In this case, the valve that separates chamber 108 from a pump or pressure source can remain open so that chamber 120 does not entirely evacuate, thus preventing the membrane 118 from pull so far into chamber 120 that the substrate becomes overstressed and damaged.

Although in several implementations the valves are described as connecting lower chamber 120 to bladder 160, the valve could be used to connect any two chambers in the carrier head, or the valve can connect a chamber in the carrier head to the ambient atmosphere. Moreover, the valve can be biased opened or closed, so that the presence of the substrate can either close or open the valve, respectively, when the valve is actuated. The valve can be positioned in parts of the carrier head other than the flexure ring. For example, the valve can be offset from the center of the carrier and attached to a base ring with the valve chamber formed between the flexure ring and the base ring. In addition, the passages formed through the carrier head to provide the fluid connections are exemplary. For example, fluid communication can be provided by a flexible hose that is coupled to fixtures on the housing hub and base ring, a first passage can connect the fixture on the base ring to the valve chamber, and a second passage can connect the valve chamber to the bladder.

The present invention has been described in terms of a number of preferred embodiments. The invention, however, is not limited to the embodiments depicted and described. The scope of the invention is defined by the appended claims.

What is claimed is:

1. A carrier head, comprising:
  a base;
  a flexible membrane that defines a first chamber and has a lower surface that provides a substrate receiving surface; and
  a valve in the carrier head that forms part of a substrate detection system, wherein the valve includes a movable structure that contacts an upper surface of the flexible membrane, and wherein the valve and flexible membrane are configured so that if a substrate is attached to the lower surface of the flexible membrane when the first chamber is evacuated, the movable structure is actuated to generate a signal to the substrate detection system.

2. The carrier head of claim 1, wherein the valve is positioned in a passage that fluidly couples the first chamber to a second chamber.

3. The carrier head of claim 1, wherein the valve is biased in a closed position, and actuation of the movable structure opens the valve.

4. The carrier head of claim 1, wherein the valve is biased in an open position, and actuation of the movable structure closes the valve.

5. The carrier head of claim 1, wherein the movable structure includes a valve stem that extends through an aperture in a support structure.

6. The carrier head of claim 5, wherein the valve stem extends slightly beyond a lower surface of the support structure.

7. The carrier head of claim 5, wherein the support structure is movable relative to the base.

8. The carrier head of claim 1, wherein the movable structure contacts the upper surface of the flexible membrane if the first chamber is evacuated.

9. The carrier head of claim 1, wherein the flexible membrane wraps around a lower portion of the movable structure if the substrate is not present.

10. A carrier head, comprising:
  a base;
  a flexible membrane that defines a first chamber and has a lower surface that provides a substrate receiving surface; and
  a valve in the carrier head that forms part of a substrate detection system, wherein the valve includes a valve stem that contacts an upper surface of the flexible membrane, and wherein the valve and flexible membrane are configured so that if a substrate is attached to the lower surface of the flexible membrane when the first chamber is evacuated, the valve is actuated to generate a signal to the substrate detection system;
  wherein the valve is biased by a spring, and the spring constant of the spring is selected so that the force from the spring is sufficient to counteract a force from a flexible membrane when the substrate is not attached, but is insufficient to counteract a force from a flexible membrane when the substrate is attached.

11. A carrier head, comprising:
  a base;
  a flexible membrane that defines a first chamber and has a lower surface that provides a substrate receiving surface; and
  a valve in the carrier head that forms part of a substrate detection system, wherein the valve includes a movable structure that projects past a support surface, and wherein the valve and flexible membrane are configured so that if a substrate is attached to the lower surface of the flexible membrane when the first chamber is evacuated, the substrate abuts the support surface and actuates the valve.

12. A carrier head, comprising:
  a base;
  a flexible membrane that defines a first chamber and has a lower surface that provides a substrate receiving surface; and
  a plurality of valves in the carrier head that form part of a substrate detection system, wherein any of the valves may be actuated to generate a signal to the substrate detection system.

13. A carrier head, comprising:

a base;

a flexible membrane that defines a first chamber and has a lower surface that provides a substrate receiving surface; and a plurality of valves in the carrier head that form part of a substrate detection system, wherein all of the valves must be actuated to generate a signal to the substrate detection system.

14. A carrier head, comprising:

a base;

a flexible membrane that defines a first chamber and has a lower surface that provides a substrate receiving surface;

a second chamber;

a passage through the base between the first and second chambers;

a first valve that is biased open and actuates to close the passage if the first chamber is evacuated when a substrate is attached to the flexible membrane; and a second valve connected in series with the first valve, the second valve biased closed and actuatable to open the passage if the second chamber is evacuated.

15. A carrier head, comprising:

a base;

a flexible membrane that defines a first chamber and has a lower surface that provides a substrate receiving surface; and a first movable structure that forms part of a substrate detection system, wherein the first movable structure contacts an upper surface of the flexible membrane and is configured so that if a substrate is attached to the lower surface of the flexible membrane when the first chamber is evacuated, the first movable structure is actuated.

16. The carrier head of claim 15, further comprising a second movable structure in the carrier head that forms part of the substrate detection system, wherein the second movable structure contacts and upper surface of the flexible membrane and is configured so that if a substrate is attached to the lower surface of the flexible membrane when the first chamber is evacuated, the second movable structure is actuated.

17. The carrier head of claim 16, wherein either the first movable structure or the second movable structure may be actuated to generate a signal to the substrate detection system.

18. The carrier head of claim 16, wherein both the first movable structure and the second movable structure must be actuated to generate a signal to the substrate detection system.

19. The carrier head of claim 15, wherein the first movable structure comprises a valve that regulates fluid flow through a passage in the carrier head.

* * * * *